United States Patent [19]
Takeuchi et al.

[11] Patent Number: 5,545,461
[45] Date of Patent: Aug. 13, 1996

[54] CERAMIC DIAPHRAGM STRUCTURE HAVING CONVEX DIAPHRAGM PORTION AND METHOD OF PRODUCING THE SAME

[75] Inventors: Yukihisa Takeuchi, Aichi-ken; Tsutomu Nanataki, Toyoake; Hideo Masumori, Anjo; Katsuyuki Takeuchi, Nagoya; Takahiro Maeda, Ichinomiya, all of Japan

[73] Assignee: NGK Insulators, Ltd., Japan

[21] Appl. No.: 386,677

[22] Filed: Feb. 10, 1995

[30] Foreign Application Priority Data

| Feb. 14, 1994 | [JP] | Japan | 6-017697 |
| Feb. 22, 1994 | [JP] | Japan | 6-024174 |
| Jun. 3, 1994 | [JP] | Japan | 6-122733 |
| Aug. 11, 1994 | [JP] | Japan | 6-189203 |
| Oct. 5, 1994 | [JP] | Japan | 6-241172 |
| Oct. 7, 1994 | [JP] | Japan | 6-244317 |

[51] Int. Cl.⁶ .............. B32B 3/10; C03B 29/00
[52] U.S. Cl. .............. 428/138; 428/49; 428/174; 428/210; 428/212; 428/219; 428/325; 156/89
[58] Field of Search .............. 428/172, 192, 428/210, 174, 49, 131, 138, 212, 219, 375; 156/89, 242

[56] References Cited

U.S. PATENT DOCUMENTS

| 4,525,464 | 6/1985 | Claussen et al. | 501/103 |
| 4,894,635 | 1/1990 | Yajima et al. | 388/2 |
| 5,089,455 | 2/1992 | Ketcham et al. | 501/104 |
| 5,210,455 | 5/1993 | Takeuchi et al. | 310/328 |

FOREIGN PATENT DOCUMENTS

| 0468796 | 1/1992 | European Pat. Off. | H01L 41/04 |
| 0526048 | 2/1993 | European Pat. Off. | H01L 41/09 |
| 0572230 | 12/1993 | European Pat. Off. | B41J 2/14 |
| 60-111600 | 6/1985 | Japan | H04R 17/00 |
| 62-213399 | 9/1987 | Japan | H04R 17/00 |
| 5-49270 | 2/1993 | Japan | H02N 2/00 |
| 5-270912 | 10/1993 | Japan | C04B 35/48 |
| 2161674 | 1/1986 | United Kingdom | H01L 41/18 |

*Primary Examiner*—Donald J. Loney
*Attorney, Agent, or Firm*—Parkhurst, Wendel & Burr

[57] ABSTRACT

A ceramic diaphragm structure which includes a ceramic substrate having at least one window, and a ceramic diaphragm plate which is superposed on the ceramic substrate so as to close the window or windows. The diaphragm plate is fired with the ceramic substrate to form an integral sintered body. The diaphragm plate includes at least one diaphragm portion which is/are aligned with the window(s), respectively, and each diaphragm portion protrudes outwards, in a direction away from the corresponding window, to form a convex shape. Also disclosed is a method of protuding such a ceramic diaphragm structure, in which the diaphragm portion is formed into convex shape, upon firing of the ceramic substrate and ceramic diaphragm plate.

13 Claims, 7 Drawing Sheets

CERAMIC DIAPHRAGM STRUCTURE HAVING CONVEX DIAPHRAGM PORTION AND METHOD OF PRODUCING THE SAME

BACKGROUND OF THE INVENTION

1. Field of the Invention

The present invention relates to a ceramic diaphragm structure, and a method of producing the diaphragm structure. In particular, the invention is concerned with a ceramic diaphragm structure having a particularly shaped thin diaphragm portion or portions.

2. Discussion of Related Art

A diaphragm structure has been widely used, for various kinds of sensors, which structure has, for example, a substrate or base with at least one window or opening formed therethrough, and a thin diaphragm plate formed of a flexible material and adapted to close the window or windows thereby to provide a diaphragm portion or portions. In recent years, this type of diaphragm structure has been increasingly used for piezoelectric/electrostrictive actuators. When the diaphragm structure is used as a component of a sensor, the sensor has appropriate means for detecting the amount of bending or flexural displacement of the diaphragm portion of the diaphragm structure, which displacement is caused by an object to be measured by the sensor. When the diaphragm structure is used as a component of a piezoelectric/electrostrictive actuator, the diaphragm portion of the structure is deformed or deflected by a piezoelectric/electrostrictive element formed on the diaphragm portion, so as to raise a pressure in a pressure chamber which is formed within the diaphragm structure.

The diaphragm structure as described above may be produced by forming an integral body which consists of the substrate serving as a base or support, and a film member which is supported by the substrate and which provides the diaphragm. For improved operating reliability, and increased heat resistance and corrosion resistance, it has been proposed to form the diaphragm structure as a fired integral ceramic body, for use in a pressure sensor or a piezoelectric/electrostrictive actuator, as disclosed in U.S. Pat. No. 4,894,635 (corresponding to JP-A-63-292032) owned by the assignee of the present application, and JP-A-5-49270 filed by the present assignee.

The integral ceramic diaphragm structure as described above is generally formed by laminating a ceramic green substrate having a window of a suitable shape, with a thin ceramic green sheet for closing the window, to thus form an integral green laminar structure having a diaphragm portion which closes the window at one of its opposite openings. The green laminar structure is then fired into the integral diaphragm structure. The inventors of the present invention found that the diaphragm portion, which is formed from the ceramic green sheet at its portion located above the window of the ceramic green substrate, may be concavely deformed or dented, or suffer from cracks, during the firing operation. The denting and cracking at the diaphragm portion are detrimental to the intended functions and operation of the diaphragm, resulting in reduced operating reliability.

The ceramic diaphragm structure as described above is normally provided with a flat diaphragm portion or portions. However, it is difficult to significantly increase the natural resonance frequency of such a flat diaphragm. Further, the flat diaphragm does not exhibit sufficiently high mechanical strength, thus making it difficult to reduce the thickness of the diaphragm. Moreover, electrode films, piezoelectric/electrostrictive film and others formed on the flat diaphragm portion cannot be satisfactorily sintered.

SUMMARY OF THE INVENTION

It is therefore a first object of the present invention to provide a ceramic diaphragm structure which is free from denting and cracking at its diaphragm portion, assuring a significantly increased natural resonance frequency and high mechanical strength of the diaphragm portion, without affecting sintering of various films formed on the diaphragm portion, which all lead to improved operating reliability of the diaphragm structure.

It is a second object of the present invention to provide a method of producing such a diaphragm structure as described above.

The first object as described above may be accomplished according to one aspect of the present invention, which provides a ceramic diaphragm structure comprising: a ceramic substrate having at least one window; and a ceramic diaphragm plate which is superposed on the ceramic substrate so as to close the window or windows, the diaphragm plate being fired with the ceramic substrate to form an integral sintered body, the diaphragm plate including at least one diaphragm portion which is aligned with the window(s), respectively, each diaphragm portion protruding outwards, in a direction away from the corresponding window, to form a convex shape.

In the ceramic diaphragm structure constructed as described above according to the present invention, each of the diaphragm portions protrudes outwards, in the direction away from the corresponding window, to form a convex shape. As compared with a conventional flat portion, therefore, the diaphragm portion of the present structure exhibits a significantly increased natural resonance frequency, and improved strength against a force applied from the side opposite to the window. Further, the diaphragm portion does not affect sintering of films (such as electrode films and P/E layer) formed by a thick-film forming method, for example, on the outer surface of the diaphragm portion, assuring high quality and high operating reliability of the resultant ceramic diaphragm structure.

The ceramic diaphragm structure according to the present invention is of a laminar type, and thus permits a relatively large number of diaphragm portions to be formed per area of the plane of the structure. In addition, the present diaphragm structure, which is formed as an integral sintered body, assures high reliability and high handling ease, and allows its diaphragm portions to be designed as desired. Further, the amount of protrusion of the diaphragm portions may be easily controlled, and the thickness of the diaphragm portions may be significantly reduced, assuring improved production efficiency.

The ceramic diaphragm structure as described above may be favorably used for piezoelectric/electrostrictive film elements, assuring remarkably improved operating reliability of the film elements. Therefore, the diaphragm structure is advantageously used for actuators, display devices, filters, microphones, sounding bodies (such as loudspeakers), various sensors, various vibrators and resonators.

In one preferred form of the above aspect of the invention, the ceramic diaphragm plate is formed of a material which contains a major component that is selected from the group consisting of stabilized zirconia, partially stabilized zirconia, alumina, and mixtures thereof.

In another preferred form of the invention, the ceramic substrate and the ceramic diaphragm plate have an average crystal grain size of not larger than 5μm. Further, the above-indicated at least one diaphragm portion may have a thickness of not greater than 30μm, and may consist of a dense body having a relative density of at least 90%.

The second object of the present invention may be accomplished according to another aspect of the invention, which provides a method of producing the ceramic diaphragm structure as defined above, comprising the steps of: (a) preparing a ceramic green substrate having at least one window; (b) preparing a thin ceramic green sheet; (c) superposing the ceramic green sheet on the ceramic green substrate to close the window or windows, thereby to provide an integral green laminar structure; and (d) firing the green laminar structure into an integral sintered body, such that the ceramic green sheet provides at least one diaphragm portion which is aligned with the window(s), respectively, each diaphragm portion being formed into convex shape upon firing of the green laminar structure, such that the diaphragm portion protrudes outwards, in a direction away from the corresponding window.

In the above-described method, the ceramic green substrate and the ceramic green sheet may be preferably prepared such that a pre-sintering temperature and a shrinkage percentage of each of the green substrate and green sheet satisfy the following formulae:

S (substrate)−S (sheet) ≧ −0.08 {$T_{70}$ (substrate)−$T_{70}$ (sheet)}−1

0 ≦ $T_{70}$ (substrate)−$T_{70}$ (sheet) ≦ 300

S (substrate)−S (sheet) ≦ 20 where, S (substrate) and S (sheet) represent respective shrinkage percentages (%) of the ceramic green substrate and the ceramic green sheet when the green substrate and green sheet are fired independently of each other at a temperature at which the green laminar structure is finally fired, the shrinkage percentages being calculated on the basis of lengths as measured in a plane of the green substrate or sheet, and where $T_{70}$ (substrate) and $T_{70}$ (sheet) represent respective pre-sintering temperatures (°C.) at which shrinkage percentages of the ceramic green substrate and the ceramic green sheet (when fired independently of each other) have reached 70% of S (substrate) and S (sheet), respectively.

In one preferred form of the above aspect of the invention, the ceramic green sheet comprises before or after firing a material which is selected from the group consisting of partially stabilized zirconia, fully stabilized zirconia, alumina and mixtures thereof. The material of the ceramic green sheet has an average particle size of 0.05 to 1.0μm. To this material may be added not greater than 30% of additives.

The above-described second object may also be accomplished according to a further aspect of the present invention, which provides a method of producing the ceramic diaphragm structure as defined above, comprising the steps of: (a) preparing a ceramic green substrate having at least one window; (b) preparing a thin ceramic green sheet; (c) superposing the ceramic green sheet on the ceramic green substrate to close the window or windows, thereby to provide an integral green laminar structure; (c) firing the green laminar structure into an integral sintered body, such that the ceramic green sheet provides at least one diaphragm portion which is aligned with the window(s), respectively; and (d) applying a pressure to each diaphragm portion while heating the integral sintered body, so that the diaphragm portion protrudes outwards, in a direction away from the corresponding window of the substrate.

BRIEF DESCRIPTION OF THE DRAWINGS

The above and optional objects, features and advantages of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
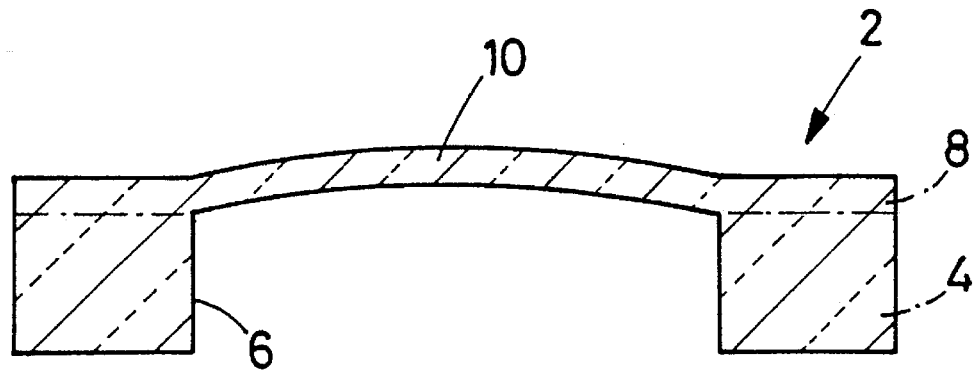
FIG. 1 is a cross sectional view showing one embodiment of a ceramic diaphragm structure of the present invention.
Figure 2:
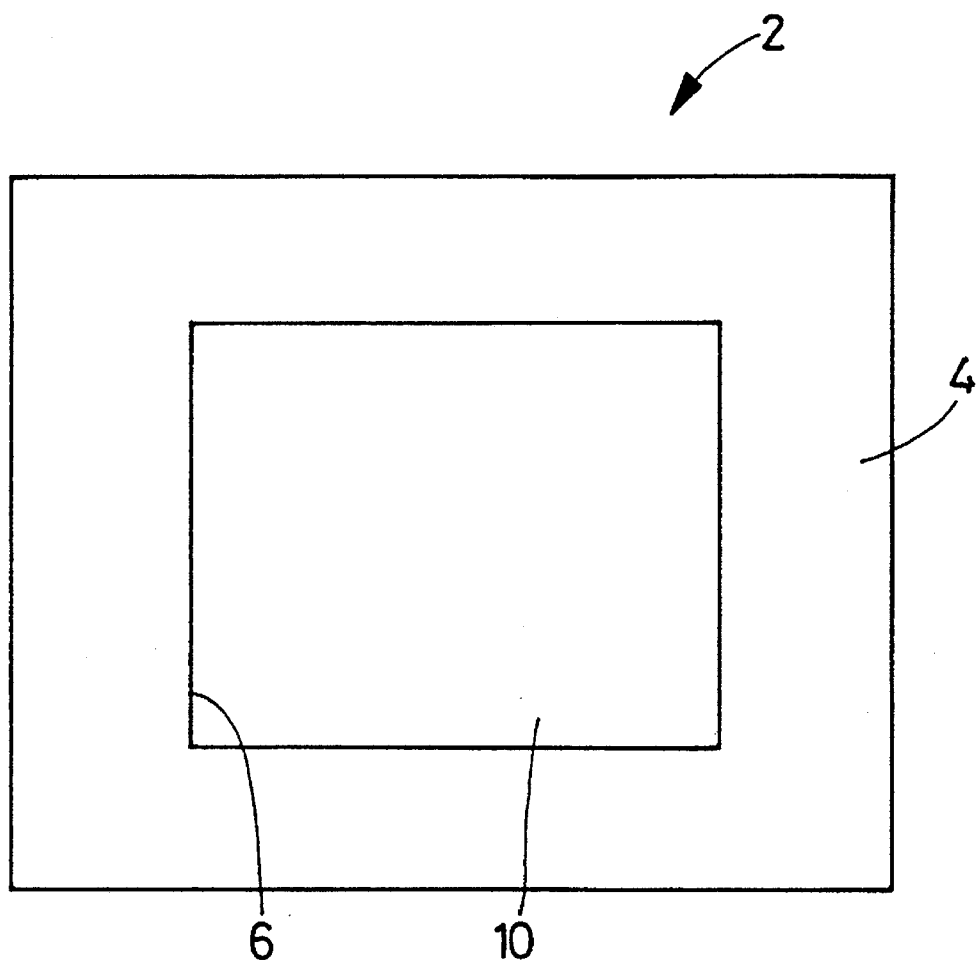
FIG. 2 is a bottom plan view of the diaphragm structure of FIG. 1.

In the ceramic diaphragm structure constructed according to the present invention as described above, the thin diaphragm portion is formed integrally on the ceramic substrate so as to close the window of the substrate, such that the diaphragm portion protrudes outwards, in the direction away from the window, to form a convex shape. Referring to FIGS. 1 and 2, there will be described one embodiment of the ceramic diaphragm structure of the present invention. This embodiment has one window formed through the ceramic substrate.

Figure 3:
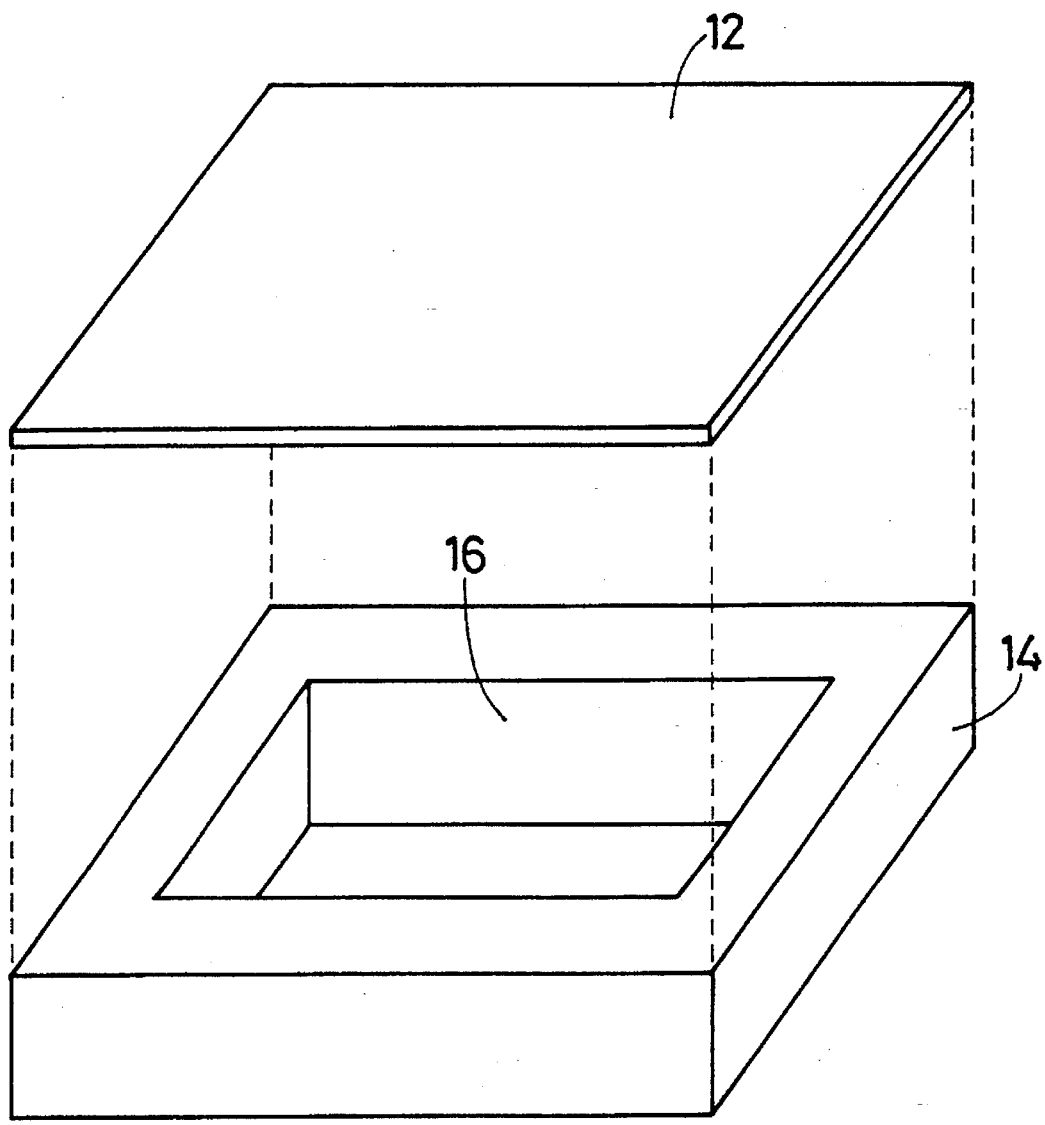
FIG. 3 is a perspective view illustrating a step in the process of producing the diaphragm structure of FIG. 1, in which a ceramic green sheet is superposed on a ceramic green substrate.

As shown in FIGS. 1 and 2, an integrally formed diaphragm structure 2 consists of a ceramic substrate or base 4 which has a rectangular window or opening 6 of a suitable size, and a thin ceramic diaphragm plate 8 which is superposed on one of opposite major surfaces of the ceramic substrate 4, so as to close one of the opposite openings of the window 6. The diaphragm plate 8 includes a diaphragm portion 10 which is aligned with the window 6 of the ceramic substrate 4, as viewed in the plane of the diaphragm plate 8. To produce the diaphragm structure 2, a thin ceramic green sheet 12 which gives the diaphragm plate 8 is superposed on a ceramic green substrate 14 which gives the ceramic substrate 4, so as to close a window 16 of the green substrate 14, as shown in FIG. 3, and these green sheet and substrate 12, 14 are bonded to each other by thermo compression, so as to provide an integral green laminar structure. Then, the green laminar structure is fired into the integral diaphragm structure 2 as shown in FIG. 1. Each of the ceramic green sheet 12 and the ceramic green substrate 14 may be formed by laminating a plurality of sheets or substrates having a smaller thickness value. It is to be understood that the shape of the window 6 of the diaphragm structure 2, in other words, the shape of the diaphragm portion 10 is by no means limited to the rectangular shape as shown in the present embodiment, but may be suitably selected depending upon the application or use of the diaphragm structure 2. For example, the diaphragm portion 10 may have a circular, polygonal or elliptical shape, or a combination of such different shapes.

Figure 4:
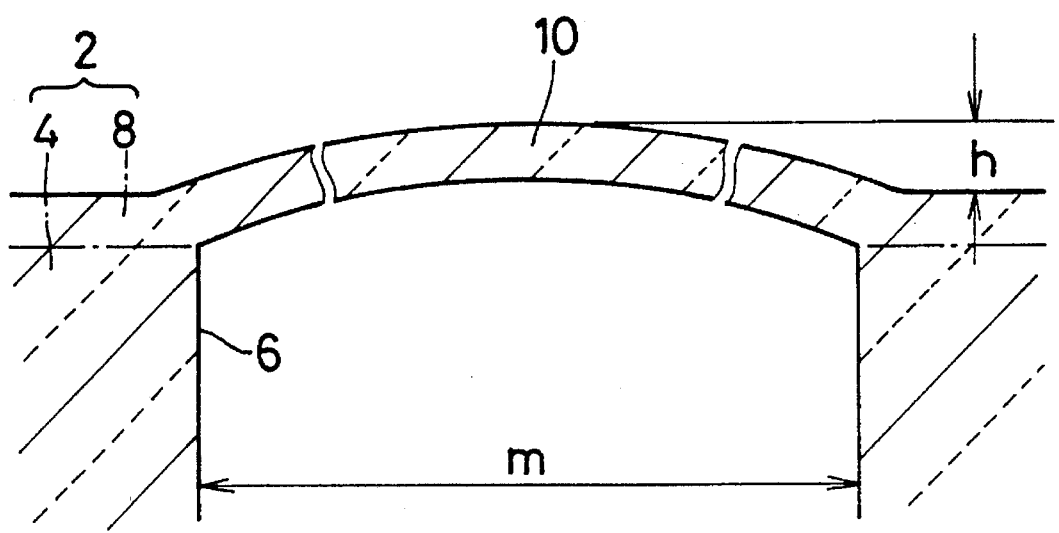
FIG. 4 is a cross sectional view showing in enlargement a principal part of the diaphragm structure of FIG. 1.

In the diaphragm structure 2 of the present embodiment, the diaphragm portion 10 has a convex shape, or protrudes outwards, in other words, in the direction away from the window 6, as shown in enlargement in FIG. 4. The thus shaped diaphragm portion 10 is not dented nor cracked, and, unlike a flat diaphragm portion, exhibits a significantly increased natural resonance frequency and increased strength against an external force, without affecting sintering of films formed on the outer surface of the diaphragm portion 10. This allows the diaphragm structure 2 to find far more diverse applications or usage. In this connection, the natural resonance frequency "f" of the diaphragm plate 8 which vibrates in operation is proportional to $(H/A^2)\sqrt{(E/\rho)}$, where 2A is the outside diameter of the diaphragm plate 8, H is the amount of protrusion of the diaphragm portion 10, E is the Young's modulus of the diaphragm material, and p is the density of the diaphragm material. Thus, the natural resonance frequency "f" can be varied as desired by controlling the amount of protrusion of the diaphragm portion 10. More specifically, the rigidness of the diaphragm plate 8 having a relative small thickness can be increased by increasing the amount of protrusion of the diaphragm portion 10, so as to increase the natural resonance frequency of the portion 10.

In the diaphragm structure 2 as described above, the amount of protrusion of the diaphragm portion 10 having a convex shape may be suitably determined depending upon the specific application or usage of the diaphragm structure 2. To assure the above-described effects of the present invention, the percentage of the amount (h) of protrusion of a central part of the diaphragm portion 10 (or maximum protrusion amount) with respect to the length (m) of the shortest line which passes the center of the window 6 of the ceramic substrate 4, in other words, protrusion percentage as represented by [y=(h/m)×100], is controlled to be not smaller than 1%. The upper limit of the protrusion percentage (y), which may also be suitably determined, is generally about 50%.

In the diaphragm structure 2 constructed according to the present invention, materials for forming the ceramic substrate 4 and ceramic diaphragm plate 8 are suitably selected from various known ceramic materials. Generally, the ceramic diaphragm plate 8 is formed of a material having a main component selected from mullire, beryllia, spinel, titania, aluminum nitride, silicon nitride, stabilized zirconia, partially stabilized zirconia, alumina, and mixtures thereof. Among these ceramic materials, stabilized zirconia, partially stabilized zirconia, alumina or a mixture thereof is desirably employed. Particularly favorably used is a material as disclosed by the present inventors in JP-A-5-270912, which contains as a main component zirconia which is partially stabilized by adding yttria or other compound, and which has a crystal phase that consists essentially of a tetragonal phase or a combination or mixture of at least two kinds of cubic, tetragonal and monoclinic phases. The diaphragm plate 8 made of the above-described material exhibits high mechanical strength, and high degrees of heat resistance and corrosion resistance, and is highly flexible with a small thickness, thereby to provide an effective diaphragm structure. To achieve the integrity of the diaphragm structure 2, the ceramic substrate 4 is desirably formed of one of the above-described materials as used for the ceramic diaphragm plate 8. However, the substrate 4 may also be formed of other ceramic material, such as glass ceramic or cordierite.

To assure sufficiently high mechanical strength of the diaphragm structure 2, the ceramic materials for the ceramic substrate 4 and the ceramic diaphragm plate 8 (diaphragm portion 10) desirably have the crystal grain size of 5μm or smaller, preferably, 3μm or smaller, and more preferably, 1μm or smaller. The thickness of the diaphragm plate 8 which provides the thin diaphragm portion 10 is desirably controlled to be not greater than 30μm, preferably, in the range of 3 to 20μm, in view of its vibrating characteristics. It is also desirable to determine the density of the diaphragm plate 8 such that the relative density (bulk density/theoretical density) is 90% or higher, preferably, 95% or higher, and more preferably, 98% or higher, in view of the strength, Young modulus and other characteristics of the diaphragm material.

The thickness and sinterability of the ceramic substrate 4 of the diaphragm structure 2 are not limited to any particular ranges, but may be appropriately determined depending upon the specific application or usage of the diaphragm structure 2. While the ceramic substrate 4 may consist of either a single layer or a plurality of sub-layers, as described above, the substrate 4 is preferably formed of the same or similar ceramic material as used for the diaphragm plate 8, to ensure increased reliability at the interface between the substrate and plate 4, 8.

The ceramic diaphragm structure 2 constructed as described above may be produced by one of various methods known to those skilled in the art. Particularly advantageously employed is a method which includes process steps (a) through (d) as follows:

Initially, the ceramic green substrate 14 having at least one window 16 is prepared in the first step (a), as shown in FIG. 3, and the ceramic green sheet 12 having a relatively small thickness is prepared in the second step (b). The ceramic materials as described above may be suitably used for forming the ceramic green sheet 12 and ceramic green substrate 14. In particular, the ceramic green sheet 12 is preferably formed of a material which contains a main component that is selected from partially stabilized zirconia, fully stabilized zirconia, alumina and mixtures thereof, or a material which gives one of the above-indicated materials after firing thereof. The ceramic material for the green sheet 12 is in the form of a powder having the average particle size of 0.05 to 1.0μm. This ceramic material is mixed with a suitable binder, plasticizer, dispersing agent, sintering aid, organic solvent and others, in a known manner, to prepare slurries or pastes. Then, the slurries or pastes are formed into the ceramic green sheet 12 and ceramic green substrate 14 having respective predetermined thicknesses, by a known method using a doctor blade machine, calender roller, or a reverse roll coater, or by printing, for example. If necessary, a plurality of thin green sheets may be laminated or stacked together, or initially prepared green sheets may be cut, machined, punched or otherwise processed, to provide the green sheet and substrate 12, 14 having desired thicknesses and shapes.

When the ceramic green sheet or ceramic green substrate 12, 14 is formed by laminating the thin green sheets, a bonding sub layer may be provided at the interface of adjacent ones of the green sheets. The bonding sub layer is formed from a slurry, paste or the like, which principally contains the above-indicated binder, plasticizer, solvent, or a mixture thereof, and the ceramic powder as indicated above. The lamination of the thin green sheets may be effected in the next step (c) as described below.

In the third step (c), the thus prepared ceramic green sheet 12 and ceramic green substrate 14 are superposed on each other, to provide a green laminar structure. More specifically, the relatively thin ceramic green sheet 12 is superposed on the ceramic green substrate 14 so as to close the window 16, and bonded thereto by thermo-compression, thereby to form the integral green laminar structure. A bonding sub layer as described above may be provided between the green sheet and green substrate 12, 14.

In the next step (d), the thus obtained green laminar structure is fired into an integral sintered body which has a thin diaphragm portion 10 formed in alignment with the window 16 of the ceramic green substrate 14. Upon firing of the green laminar structure, the diaphragm portion 10 protrudes outwards, that is, in the direction away from the window 16 (6), to form a convex shape as shown in FIGS. 1 and 4. The firing temperature is generally controlled to be in the range of 1200° C. to 1700° C., preferably, in the range of 1300° C. to 1600° C.

To cause the diaphragm portion 10 of the ceramic green sheet 12 to protrude outwards upon firing of the integral green laminar structure, the sintering speed and shrinkage percentage of the ceramic green sheet 12 and green substrate 14 are controlled by suitably selecting the ceramic materials for the green sheet and substrate 12, 14, the particle size of a powder of the selected ceramic material, and kinds and amounts of additives, such as a binder, dispersing agent and sintering aid. According to one aspect of the present invention, the pre-sintering temperature and shrinkage percentage of the ceramic green sheet 12 and ceramic green substrate 14 are determined so as to satisfy the following formulae (1)–(1"):

$$S \text{ (substrate)} - S \text{ (sheet)} \geq -0.08 \{T_{70} \text{ (substrate)} - T_{70} \text{ (sheet)}\} - 1 \quad (1)$$

$$0 \leq T_{70} \text{ (substrate)} - T_{70} \text{ (sheet)} \leq 300 \quad (1')$$

$$S \text{ (substrate)} - S \text{ (sheet)} \leq 20 \quad (1'')$$

where, S (substrate) and S (sheet) represent respective shrinkage percentages (%) of the ceramic green substrate and ceramic green sheet when each of these substrate and sheet is fired at the same temperature as the final firing temperature of the green laminar structure, the shrinkage percentages being calculated on the basis of lengths as measured in the plane of the substrate or sheet. $T_{70}$ (substrate) and $T_{70}$ (sheet) represent pre-sintering temperatures (°C.) at which the shrinkage percentages of the ceramic green substrate and ceramic green sheet (when fired independently of each other) reach 70% of S (substrate) and S (sheet), respectively. In this manner, the diaphragm portion 10 is effectively protruded outwards at the time of firing of the laminar structure consisting of the ceramic green sheet 12 and ceramic green substrate 14.

The shrinkage percentage as indicated above is represented by [(LENGTH A–LENGTH B)/LENGTH A]×100 (%), where LENGTH A is the length when measured before firing, and LENGTH B is the length when measured after firing. The LENGTHs B of the substrate and sheet are measured after the substrate and sheet are fired independently of each other. The lengths (LENGTH A and LENGTH B) indicated above are measured in the plane of the sheet or substrate, that is, in a predetermined direction which is parallel to the major surfaces of the sheet or substrate and perpendicular to the thickness direction thereof. The above-indicated pre-sintering temperature $T_{70}$ (substrate) or $T_{70}$ (sheet) indicates the temperature at which the shrinkage percentage calculated in the manner as described above reaches [S (substrate) or S (sheet)]×0.7 (%) or (0.7S%), during the independent firing processes of the substrate and sheet (not in a laminar structure), where "S" is the whole shrinkage percentage of the substrate or sheet which is measured when the substrate or sheet is fired without lamination thereof, in the same temperature control profile or pattern as used for firing the diaphragm structure. Further, "T" indicates the sinterability of the substrate or sheet, and should be controlled so that the sintering speed or rate of the thin ceramic green sheet 12 is higher than that of the ceramic green substrate 14. Even if this condition is satisfied, the resultant diaphragm structure does not necessarily have a convex diaphragm portion, but may have a flat diaphragm portion, depending upon the shrinkage percentage (S) as measured at the final firing temperature. Thus, all of the above-indicated relationships between "S" and "T" as indicated in the formulae (1), (1'), (1") need to be satisfied to ensure that the diaphragm structure is provided with the convex diaphragm portion.

If the sinterability excessively differs between the ceramic green sheet 12 and the ceramic green substrate 14, that is, the value of [$T_{70}$ (substrate)–$T_{70}$ (sheet)] is larger than 300, the convex shape of the diaphragm portion may become unstable, or cracks may be formed in the diaphragm portion. As described above, "S" indicates the shrinkage percentage of the green substrate or sheet when each of these is fired at the firing temperature which is actually employed when firing the substrate and sheet into an integral diaphragm structure. If the shrinkage percentage excessively differs between the ceramic green sheet and substrate 12, 14, that is, the value of [S (substrate)–S (sheet)] is larger than 20, the diaphragm structure may warp to a great extent after firing thereof, or cracks may be formed in the diaphragm plate 8.

In the method of producing the ceramic diaphragm structure according to the present invention, the ceramic green sheet 12 and the ceramic green substrate 14 are preferably prepared to satisfy the following formulae (2), (2') and (2"), in order to assure high stability in the convex shape of the diaphragm portion, and reduce or prevent warpage of the diaphragm structure 2 and residual stresses remaining in the diaphragm plate 8 after its firing.

$$S \text{ (substrate)} - S \text{ (sheet)} \geq -0.08 \{T_{70} \text{ (substrate)} - T_{70} \text{ (sheet)}\} + 0.8 \quad (2)$$

$$10 \leq T_{70} \text{ (substrate)} - T_{70} \text{ (sheet)} \leq 200 \quad (2')$$

$$S \text{ (substrate)} - S \text{ (sheet)} \leq 10 \quad (2'')$$

More preferably, the ceramic green sheet 12 and the ceramic green substrate 14 are prepared to satisfy the following formulae (3), (3') and (3").

$$S \text{ (substrate)} - S \text{ (sheet)} \geq -0.08 \{T_{70} \text{ (substrate)} - T_{70} \text{ (sheet)}\} + 0.8 \quad (3)$$

$$10 \leq T_{70} \text{ (substrate)} - T_{70} \text{ (sheet)} \leq 100 \quad (3')$$

$$S \text{ (substrate)} - S \text{ (sheet)} \leq 5 \quad (3'')$$

Figure 5:
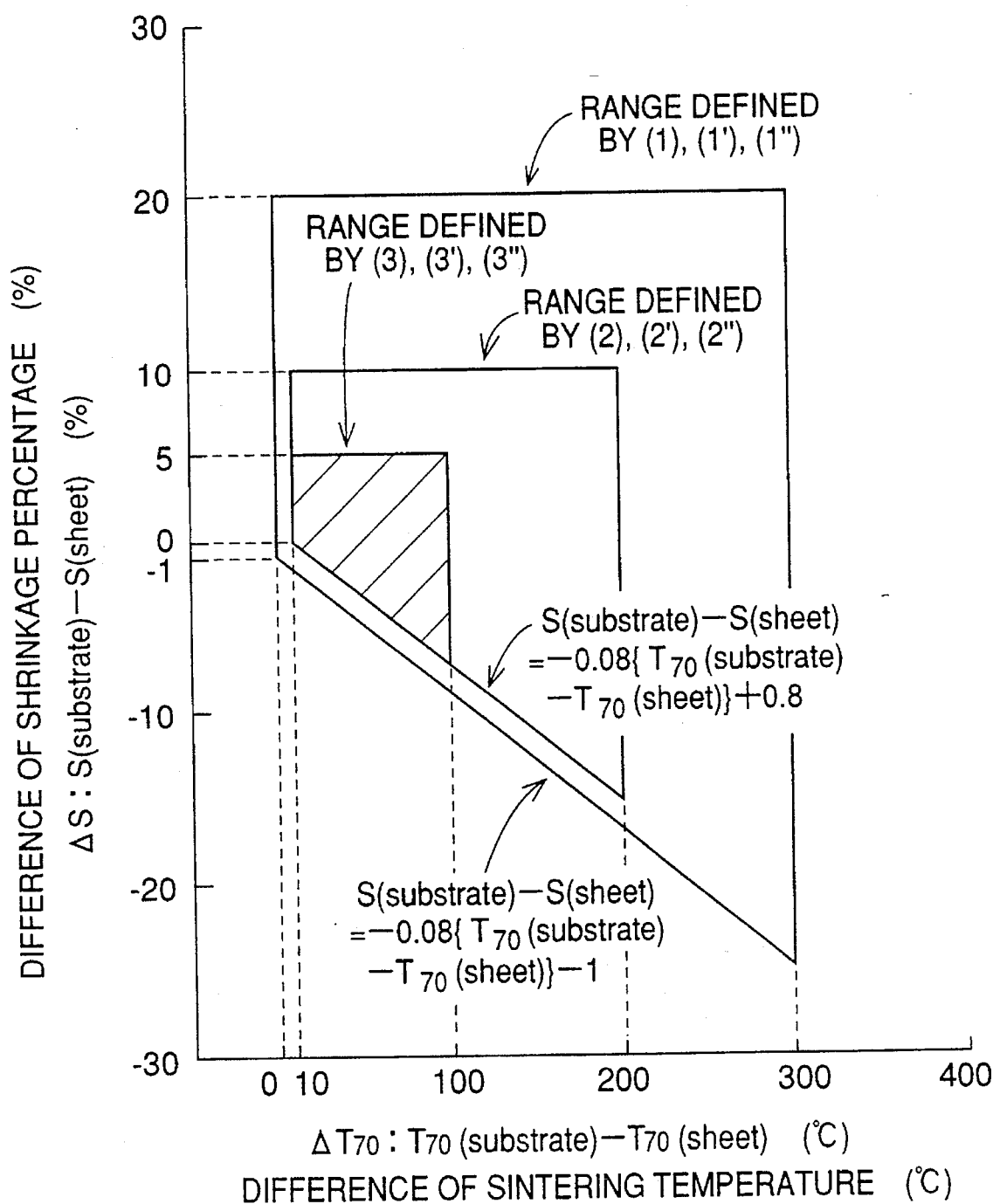
FIG. 5 is a graph showing the relationship between the difference ΔS in the shrinkage percentage and the difference $\Delta T_{70}$ in the pre-sintering temperature between the ceramic green sheet and ceramic green substrate, which are fired into the diaphragm structure of FIG. 1.

The ranges of the differences of the shrinkage percentages (S) and pre-sintering temperatures (T) as defined by the above formulae (1) through (3") are indicated in FIG. 5.

According to the second method of producing the ceramic diaphragm structure constructed according to the present invention, the integral green laminar structure obtained according to the process steps (a) through (c) is then fired in the next step (e), to provide an integral sintered body in which the thin diaphragm portion (10) is formed in alignment with the window 16 of the ceramic substrate. In the next step (f), a pressure is applied to the diaphragm portion (10) while heating the thus obtained sintered body, so that the diaphragm portion (10) protrudes outwards, that is, in the direction away from the window 16 (6).

In the process step (f) of the second method, the sintered body is first heated at a temperature that is substantially equal to or lower than the sintering temperature, so as to allow the sintered body to be deformed. Then, a mechanical force from a suitable jig or the like, or a fluid pressure may be applied to the diaphragm portion (10), for example, so as to cause the diaphragm portion (10) to protrude outwards and form a convex shape. After cooling of the heated sintered body, the diaphragm structure 2 is formed with the diaphragm portion 10 which protrudes outwards by an intended or desired amount (h). However, the first method including the steps (a)–(d) is preferably employed for producing the diaphragm structure 2, in view of higher production efficiency, as compared with the second method as described just above.

The ceramic diaphragm structure 2 thus obtained according to the present invention is free from denting, cracking and other defects at the diaphragm portion 10 thereof, assuring excellent quality and high operating reliability. In addition, the diaphragm portion 10 provides high mechanical strength and a significantly increased natural resonance frequency, and does not affect sintering of films formed on the outer surface of the portion 10. Accordingly, the present diaphragm structure 2 can be advantageously used for various applications, such as sensors and actuators. Further, due to advantageous properties of the ceramic material(s) used therein, the present diaphragm structure 2 can be favorably used as a part of a device, conduit or the like which requires high corrosion resistance, together with various detecting means such as a strain gauge, so as to provide a corrosion-resistant pressure sensor adapted to monitor the internal pressure or other parameter of the device or conduit. The diaphragm structure 2 can also be used with a suitable driving source, such as air pressure or a push rod, to provide an actuator which provides a relatively large amount of displacement at a relatively low frequency.

Figure 6:
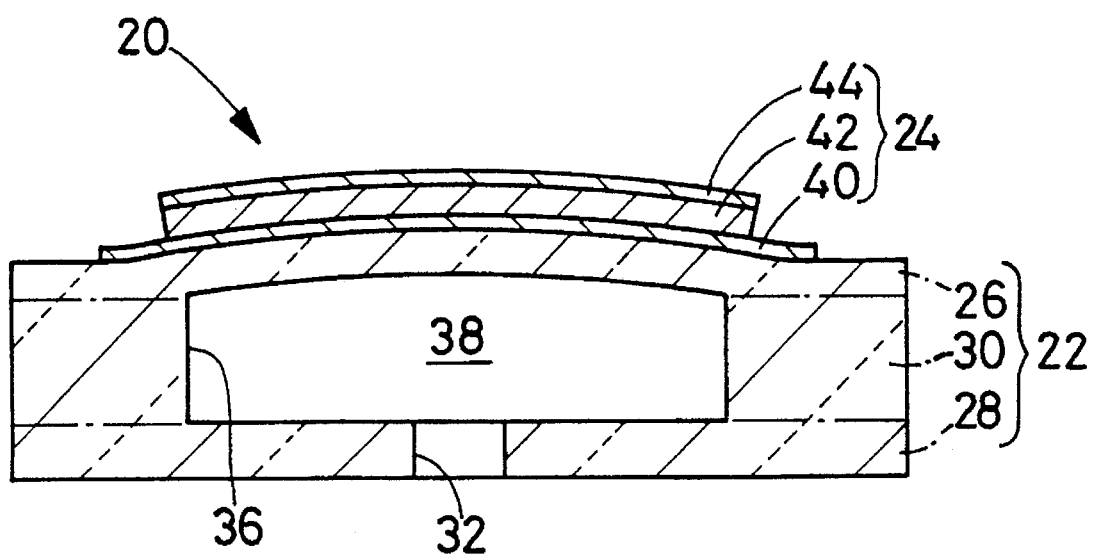
FIG. 6 is a cross sectional view showing an example of a piezoelectric/electrostrictive film element using the ceramic diaphragm structure according to the present invention.
Figure 7:
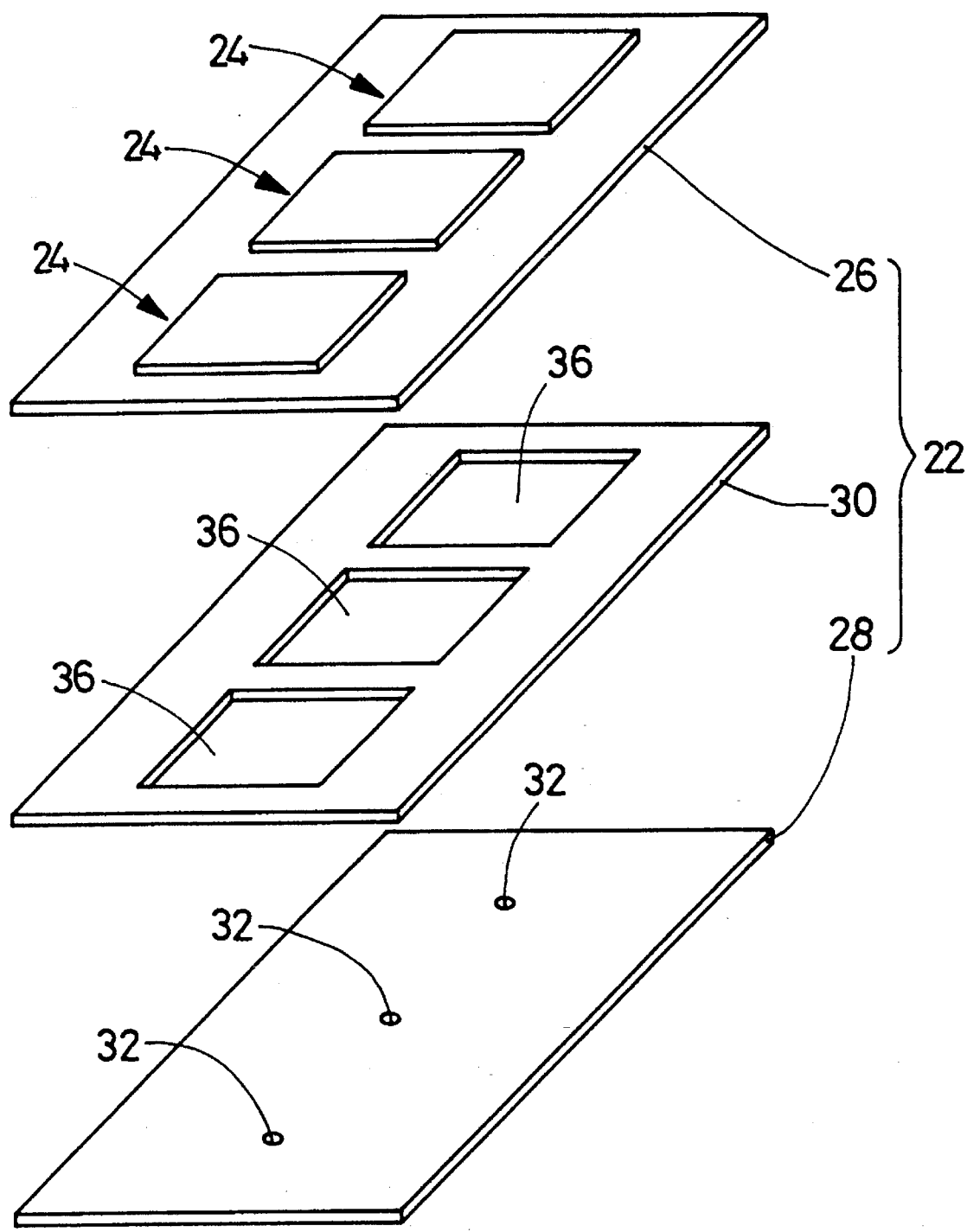
FIG. 7 is an exploded perspective view of the piezoelectric/electrostrictive film element of FIG. 6.

The ceramic diaphragm structure of the present invention is advantageously used for a piezoelectric/electrostrictive film element, in which a piezoelectric/electrostrictive unit is formed on one of opposite major surfaces of the diaphragm portion of the structure. In particular, the present diaphragm structure is favorably used for uni-morph or other types of piezoelectric/electrostrictive film elements which are adapted to generate or detect displacement or force in the form of bending, deflection or flexure, and which are used for actuators, filters, display devices, acceleration sensors, shock sensors, transformers, microphones, sounding bodies (such as loudspeakers), various resonators or vibrators for power devices and communication devices. FIG. 6 schematically shows an example of a piezoelectric/electrostrictive film element including one embodiment of the ceramic diaphragm structure of the present invention, and FIG. 7 is an exploded perspective view of the film element. The piezoelectric/electrostrictive film element 20 as shown in these figures has a diaphragm structure 22, and piezoelectric/electrostrictive units (hereinafter referred to as P/E units) 24 disposed on the diaphragm structure 22. More specifically, the P/E units 24 are bonded to and formed integrally on the outer surfaces of respective diaphragm portions of the structure 22. In operation, the P/E units 24 are adapted to cause deflection or deformation of the corresponding diaphragm portions of the structure 22, upon application of a voltage to the P/E units 24.

Figure 8:
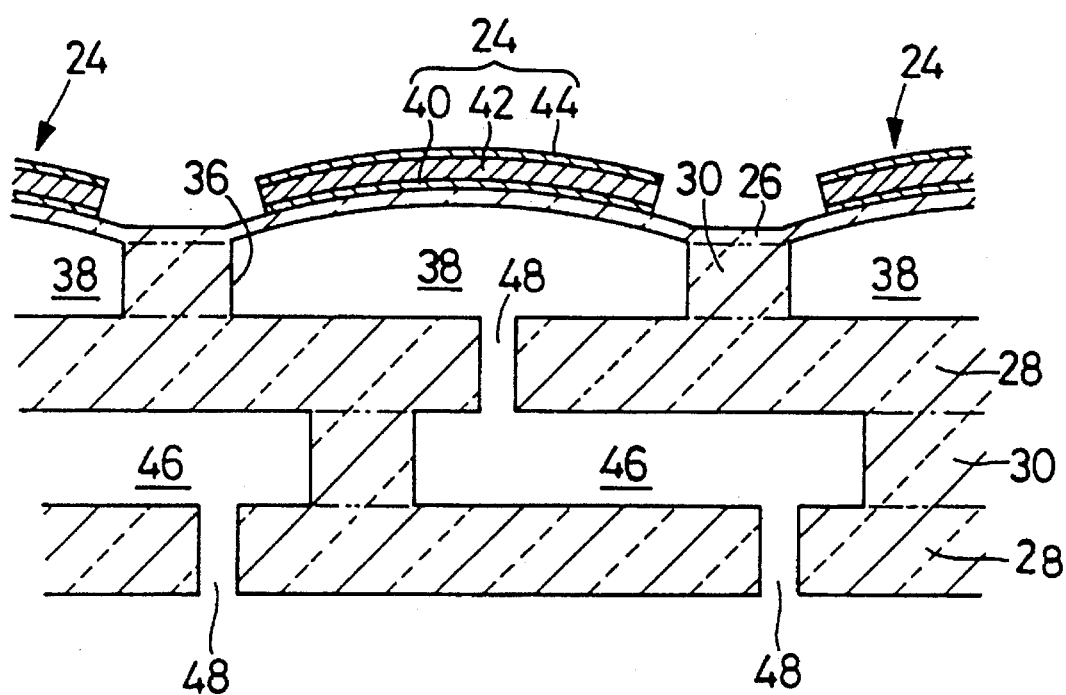
FIG. 8 is a cross sectional view showing another example of the piezoelectric/electrostrictive film element which has a five-layer structure.

More specifically described, the diaphragm structure 22 constructed according to the present invention has a laminar structure which consists of a relatively thin closure plate (diaphragm portion) 26, a connecting plate (substrate) 28, and a spacer plate (substrate) 30 that is interposed between the closure and connecting plates 26, 28. These plates 26, 28, 30 are formed of suitable ceramic materials, such as zirconia. The connecting plate 28 has a plurality of communication holes 32 (three holes 32 in this embodiment), which are spaced apart from each other at a predetermined interval in the longitudinal direction of the plate 28, as shown in FIG. 7. These communication holes 32 communicate with an external space. The spacer plate 30 has a plurality of square windows or apertures 36 (three windows 36 in this embodiment) formed therethrough. These windows 36 are spaced apart from each other at a predetermined interval in the longitudinal direction of the spacer plate 30. The spacer plate 30 is superposed on the connecting plate 28 such that the communication holes 32 formed through the connecting plate 28 are open to the respective windows 36. While only one communication hole 32 is provided for each of the windows 36 in this embodiment, two or more communication holes may be provided for each window 36, depending upon the specific application of the piezoelectric/electrostrictive film element 20. The shape, position and dimensions of the communication hole 32 may also be suitably determined as desired, depending upon the application of the film element 20. The above-indicated closure plate 26 is superposed on one of the opposite major surfaces of the spacer plate 30 remote from the connecting plate 28, so as to close the windows 36 of the spacer plate 30. In this arrangement, a plurality of pressure chambers 38 are formed within the diaphragm structure 22, such that the pressure chambers 38 are held in communication with the space outside the structure 22, through the respective communication holes 32. While the diaphragm structure 22 consists of three-layer integral structure, that is, the closure plate 26 (diaphragm), spacer plate 30 (substrate) and connecting plate 28 (substrate), the diaphragm structure of the invention may be formed as a four-layer or other multi-layer integral structure having four or more layers, as illustrated in FIG. 8.

As described above, the diaphragm structure 22 is formed as an integral fired or sintered body which is made principally of a suitable ceramic material, such as zirconia, and has diaphragm portions (26) which protrude outwards, that is, in the direction away from the windows 36. To produce this diaphragm structure 22, green sheets are initially formed by a generally used machine, such as a doctor blade machine, reverse roll coater or screen printing machine, using slurries or pastes that are prepared from suitable ceramic materials, binder and solvent, for example. Then, the green sheets are subjected to cutting, machining, punching or other process as needed, so as to form the windows 36 and communication holes 32, and thus provide precursors which give the respective plates 26, 28, 30. Then, these precursors are laminated on each other, and bonded together by thermo-compression, into an integral green laminar structure. Thereafter, the green laminar structure is fired into the integral diaphragm structure 22, such that the diaphragm portions as part of the closure plate 26 are projected or protruded outwards by one of the above-described methods.

The piezoelectric/electrostrictive units 24 are formed on the outer surface of the closure plate 26 of the diaphragm structure 22, such that the units 24 are aligned with the respective pressure chambers 38, as viewed in the plane parallel to the outer surface of the plate 26. Each of the P/E units 24 includes a lower electrode 40, a piezoelectric/electrostrictive layer (hereinafter referred to as P/E layer) 42 and an upper electrode 44, which are formed in lamination in this order on the convex outer surface of the corresponding diaphragm portion of the closure plate 26, by a suitable film-forming method. For the P/E units 24, it is particularly preferable to employ a piezoelectric/electrostrictive element as proposed in co-pending U.S. patent application Ser. No. 08/239,856 assigned to the assignee of the present patent application, which corresponds to JP-A-5-29675, and in U.S. Pat. No. 5,210,455.

The upper and lower electrode films 44, 40 and P/E layer 42 of each P/E unit 24 are formed on the outer surface of the corresponding diaphragm portion of the closure plate 26 of the diaphragm structure 22, by any one of various known methods including thick-film forming methods, such as screen printing, spraying, dipping and coating, and thin-film forming methods, such as ion-beam method, sputtering, vacuum vapor deposition, ion plating, CVD and plating. The materials used for forming the electrode films 40, 44 and P/E layer 42 may be suitably selected from various known materials and those material as disclosed in the above-identified co-pending U.S. Patent Application. The thickness of the P/E unit 24 consisting of the electrode films 40, 44 and P/E layer 42 is generally 100μm or smaller. The thickness of each electrode film 40, 44 is generally 20μm or smaller, preferably 5μm or smaller. The thickness of the P/E layer 42 is preferably 50μm or smaller, more preferably in the range of 3μm to 40μm, so that the diaphragm portion on which the P/E unit 24 is formed can undergo a sufficiently large amount of flexural displacement by application thereto a relatively low voltage.

In the thus constructed piezoelectric/electrostrictive film element 20 in which the piezoelectric/electrostrictive units 24 are formed integrally on the respective diaphragm portions (26) of the diaphragm structure 22, the diaphragm portion (26) effectively undergoes flexural displacement upon actuation of the corresponding P/E unit 24, whereby the pressure in the pressure chamber 38 is increased so as to effectively cause a fluid in the pressure chamber 38 to be delivered out of the chamber 38.

In the above-described example using the diaphragm structure according to the present invention, the diaphragm portions (26) having the P/E units 24 thereon are formed in convex shape, or protrude outwards, and therefore exhibits effectively increased rigidity, mechanical strength and natural resonance frequency, resulting in significantly improved operating response. Further, the convex diaphragm portion (26) does not affect sintering of films, such as the P/E layer 42, which are formed on the outer surface of the diaphragm portion (26), and strains and stresses arising in the P/E unit 24 are converted with high efficiency into displacement of the corresponding diaphragm portion (26). In addition, when a plurality of P/E units 24 are activated at the same time, the amount of displacement of the individual diaphragm portions is not substantially reduced, as compared to the case where only one P/E unit 24 is activated. Thus, the amount of displacement of the diaphragm portion(s) does not vary depending upon the state of activation of the P/E unit(s) 24, assuring high uniformity in the displacement amount and quality of the piezoelectric/electrostrictive film element 20. The film element constructed as described above may also be used as a sensor which generates a voltage signal indicative of flexural displacement or force that is detected at the diaphragm portion.

While the ceramic diaphragm structure of the present invention is advantageously used as a component of the piezoelectric/electrostrictive film element of the above example, it is to be understood that the diaphragm structure may also be used for other types of piezoelectric/electrostrictive film elements, or for loudspeakers, sensors, vibrators, resonators, filters, display devices and transformers, for example. Further, the present diaphragm structure may be advantageously used as a component of uni-morph, bi-morph or other types of piezoelectric/electrostrictive actuators, which are used for servodisplacement elements, pulse-driven motors and ultrasonic motors, as described in "FUNDAMENTALS TO APPLICATIONS OF PIEZOELECTRIC/ELECTROSTRICTIVE ACTUATORS", Kenji Uchino, Japan Industrial Technology Center, published by Morikita Shuppan.

EXAMPLES

To further clarify the principle of the present invention, there will be described some examples of the ceramic diaphragm structure of the present invention. It is however to be understood that the present invention is not limited to the details of the following examples, but may be embodied with various changes, modifications and improvements, which may occur to those skilled in the art, without departing from the scope of the present invention.

Example 1

Initially, twelve specimens (A-L) of ceramic materials were prepared to form Samples Nos. 1–36 of the diaphragm structure 22 used for the piezoelectric/electrostrictive film element 20 as shown in FIGS. 6 and 7. While a slight amount of alumina, when added to the ceramic material (zirconia), functions to promote sintering of the ceramic material, an excessively large amount of alumina impede or prevent the sintering.

TABLE 1

|   | Ceramic material | Additive | Amount (wt. %) of additive |
|---|---|---|---|
| A | zirconia | $Al_2O_3$ | 0.5 |
| B | partially | $Al_2O_3$ | 0.25 |
| C | stabilized by | $Al_2O_3$ | 0.15 |
| D | 3 mol % $Y_2O_3$ | $Al_2O_3$ | 0 |
| E | zirconia | $Al_2O_3$ | 40 |
| F | partially | $Al_2O_3$ | 20 |
| G | stabilized by 3 mol % $Y_2O_3$ | $Al_2O_3$ | 10 |
| H | zirconia | $Al_2O_3$ | 0.5 |
| I | fully stabilized by 8 mol % $Y_2O_3$ | $Al_2O_3$ | 0 |
| J | alumina | — | — |
| K | mullite | — | — |
| L | spinel | — | — |

Subsequently, green sheets having various thickness values were formed by an ordinary method, using the above-indicated specimens A–L of the ceramic materials. The green sheets thus formed were then subjected as needed to cutting, machining, punching and other processes, so as to form green bodies for the closure plate 26, connecting plate 28 and spacer plate 30 of each sample of the diaphragm structure 22 used for the piezoelectric/electrostrictive film element 20 as shown in FIGS. 6 and 7. A slurry for forming the green sheets was prepared by mixing 100 parts by volume of a powder of the selected ceramic material with polyvinyl butyral resin as a binder, and dibutyl phthalate as a plasticizer, a total amount of which was 60 parts by volume, a dispersing agent containing sorbitan, as needed, and 500 parts by volume of a mixture of toluene and isopropyl alcohol (50:50 by volume) as a solvent. These ingredients were mixed in a ball mill for 5 to 20 hours, and the obtained slurry was then subjected to a degassing process, to form intended green sheets by a doctor blade method, such that a slurry for the green sheets for the closure plate 26 had a viscosity of 2000 cps while a slurry for the green sheets for the connecting plate 28 and spacer plate 30 had a viscosity of 20000 cps. The shrinkage percentage of the thus obtained green sheets was controlled by adjusting a period of time for which the ingredients were mixed in the ball mill, or adding the dispersing agent in sorbitan series, so as to control the density of the green bodies for the plates 26, 28, 30, or by controlling the final firing temperature at which the green sheets were finally fired into the plates 26, 28, 30. The longer the period of the mixing time, the smaller the shrinkage percentage. The shrinkage percentage is also reduced by adding the dispersing agent containing sorbitan, or lowering the final firing temperature upon firing of the green sheets.

The above-indicated ceramic materials A through L were used to form the green bodies for the closure plate 26, connecting plate 28 and spacer plate 30 in the above manner, to provide samples No. 1–36 of the diaphragm structure 22 having respective combinations of the materials as indicated in TABLES 2 and 3 below. For each sample, the green bodies for the closure plate 26, connecting plate 28 and spacer plate 30 were superposed on each other, and then thermo-compressed under 200 kgf/cm, at 100° C. for 1 min., so as to provide an integral green laminar structure. In these samples, the green bodies for the connecting plate 28 and the spacer plate 30 were formed from the same green sheets. The thus obtained integral laminar structure was kept for three hours at the firing temperature as shown in TABLES 4 and 5 below, and thus fired, to provide the intended diaphragm structure 22. For the samples having odd numbers, the windows 36 of the spacer plate 30 of the diaphragm structure 22, or the diaphragm portions, had a circular shape having the diameter of 2 mm. For the samples having even numbers, on the other hand, the windows 36 or diaphragm portions had a rectangular shape of 0.5 mm×0.7 mm. Each sample had three windows, which were spaced apart from each other at an interval of 0.3 mm. In the case of the rectangular windows, the 0.3 mm-spacing was provided in the direction in which the short side (of 0.5 mm) of the rectangle extended. In TABLES 4 and 5 below, there are also indicated respective differences of the pre-sintering temperatures and the shrinkage percentages between the green body for the closure plate 26 and the green bodies for the connecting plate 28 and spacer plate 30, which are respectively represented by $\Delta T_{70} = T_{70}$ (substrate) $- T_{70}$ (sheet), and $\Delta S = S$ (substrate) $- S$ (sheet).

Ten specimens of each sample of the thus obtained diaphragm structure were checked for the shape of the diaphragm portions (26) and cracking, and, for those having convex diaphragm portions, the stability of the convex shape was evaluated based on a variation in the amount of protrusion. That is, the amounts of protrusion of the diaphragm portions of the ten specimens were measured, and each sample was evaluated as "excellent", "good" or "average", depending upon a variation in the protrusion amount among the ten specimens. "Excellent" means a relatively small variation, "good" means a medium variation, and "average" means a relatively larger variation. The results of the evaluation are also indicated in TABLE 4 and 5.

TABLE 2

| Sample No. | Closure plate 26 | | Connecting plate 28 Spacer plate 30 | |
|---|---|---|---|---|
| | 1) Particle size (μm) | Thickness (μm) 2) | 1) Particle size (μm) | Thickness (μm) 3) |
| *1 | A 0.05 | 13 | A 0.7 | 100 |
| 2 | A 0.05 | 13 | A 1.0 | 100 |
| 3 | A 0.05 | 13 | A 1.0 | 100 |
| *4 | A 0.05 | 13 | G 1.0 | 100 |
| 5 | A 0.4 | 5 | G 0.4 | 100 |
| 6 | A 0.4 | 15 | G 0.4 | 300 |
| 7 | A 0.4 | 30 | G 0.4 | 1000 |
| 8 | A 0.4 | 10 | A 0.4 | 300 |
| 9 | A 0.4 | 10 | B 0.4 | 300 |
| 10 | A 0.4 | 10 | F 0.2 | 300 |
| 11 | A 0.4 | 10 | G 0.4 | 300 |
| 12 | A 0.4 | 10 | E 0.2 | 300 |
| 13 | A 0.4 | 10 | L 0.05 | 300 |
| 14 | A 0.4 | 13 | B 0.7 | 100 |
| 15 | A 0.4 | 13 | D 0.4 | 100 |
| 16 | A 0.4 | 13 | E 0.2 | 100 |
| 17 | A 0.4 | 13 | K 0.2 | 100 |
| 18 | A 0.7 | 10 | D 0.7 | 300 |
| 19 | A 0.7 | 10 | E 0.2 | 300 |
| 20 | A 0.7 | 10 | L 0.02 | 300 |

*Comparative Examples
1) Ceramic material
2) Thickness of the closure plate 26 after its firing
3) Total thickness of the connecting plate 28 and spacer plate 30 after firing thereof

TABLE 3

| Sample No. | Closure plate 26 | | Connecting plate 28 Spacer plate 30 | |
|---|---|---|---|---|
| | 1) Particle size (μm) | Thickness (μm) 2) | 1) Particle size (μm) | Thickness (μm) 3) |
| 21 | A 0.7 | 10 | L 0.05 | 300 |
| 22 | B 0.05 | 13 | K 0.2 | 100 |
| *23 | B 0.2 | 13 | K 0.4 | 100 |
| *24 | B 0.4 | 10 | J 0.2 | 300 |
| *25 | B 0.4 | 10 | A 0.4 | 300 |
| 26 | B 1.0 | 10 | K 0.2 | 300 |
| 27 | B 1.0 | 10 | K 0.05 | 300 |
| *28 | C 1.0 | 10 | K 0.05 | 300 |
| *29 | D 0.2 | 10 | A 0.7 | 300 |
| 30 | D 0.05 | 13 | D 1.0 | 100 |
| 31 | F 0.2 | 13 | F 0.4 | 300 |
| *32 | H 1.0 | 13 | L 0.05 | 100 |
| 33 | H 0.4 | 13 | I 0.4 | 100 |
| 34 | I 0.2 | 13 | H 1.0 | 300 |
| 35 | J 0.2 | 10 | J 0.2 | 300 |
| 36 | B 0.4 | 10 | C 0.4 | 300 |

*Comparative Examples
1) Ceramic material
2) Thickness of the closure plate 26 after its firing
3) Total thickness of the connecting plate 28 and spacer plate 30 after firing thereof

TABLE 4

| Sample No. | $\Delta T_{70}$ (°C.) | $\Delta S$ (%) | Firing temp. (°C.) | Shape of diaphragm | Stability of convex shape |
|---|---|---|---|---|---|
| *1 | 150 | −15 | 1350 | flat | — |
| 2 | 200 | −15 | 1450 | convex | good |
| 3 | 200 | −17 | 1425 | convex | average |
| *4 | 260 | −25 | 1400 | flat | — |
| 5 | 60 | 2 | 1450 | convex | excellent |
| 6 | 60 | 1 | 1450 | convex | excellent |
| 7 | 60 | −2 | 1450 | convex | excellent |
| 8 | 0 | −1 | 1450 | convex | average |
| 9 | 10 | 5 | 1450 | convex | excellent |
| 10 | 10 | 0 | 1450 | convex | excellent |
| 11 | 60 | 2 | 1450 | convex | excellent |
| 12 | 60 | 8 | 1450 | convex | good |
| 13 | 250 | 13 | 1550 | convex | average |
| 14 | 60 | 0 | 1450 | convex | excellent |
| 15 | 100 | 0 | 1450 | convex | excellent |
| 16 | 60 | 6 | 1550 | convex | good |
| 17 | 210 | 0 | 1600 | convex | average |
| 18 | 150 | −5 | 1500 | convex | good |
| 19 | 10 | 10 | 1450 | convex | good |
| 20 | 100 | 18 | 1550 | convex | average |

*Comparative Example

TABLE 5

| Sample No. | $\Delta T_{70}$ (°C.) | $\Delta S$ (%) | Firing temp. (°C.) | Shape of diaphragm | Stability of convex shape |
|---|---|---|---|---|---|
| 21 | 200 | 10 | 1600 | convex | good |
| 22 | 300 | 0 | 1600 | convex | average |
| *23 | 350 | 0 | 1650 | cracking | — |
| *24 | −10 | 7 | 1450 | concave | — |
| *25 | −10 | −1 | 1450 | concave | — |
| 26 | 100 | 12 | 1600 | convex | average |
| 27 | 0 | 15 | 1500 | convex | average |
| *28 | −10 | 15 | 1500 | concave | — |
| *29 | 70 | −10 | 1450 | flat | — |
| 30 | 300 | −25 | 1500 | convex | average |
| 31 | 100 | −7 | 1475 | convex | excellent |
| *32 | 150 | 21 | 1600 | cracking | — |
| 33 | 100 | 5 | 1500 | convex | excellent |
| 34 | 120 | −9 | 1450 | convex | average |
| 35 | 0 | 5 | 1450 | convex | average |
| 36 | 10 | 1 | 1450 | convex | excellent |

*Comparative Example

It will be apparent from the above results that when the green body for the closure plate 26 and the green bodies for the connecting plate 28 and spacer plate 30 are selected in the above combinations so as to satisfy the above-indicated formulae (1), (1') and (1") with respect to the differences $\Delta T_{70}$, $\Delta S$ in the pre-sintering temperature and the shrinkage percentage, the diaphragm portions (26) of the resultant diaphragm structure 22 are advantageously free from cracking and denting, and are formed in a convex shape, that is, protrude outwards, in the direction away from the windows 36.

Example 2

Another example of the diaphragm structure 22 having flat diaphragm portions (26) but not including the connecting plate 28 was produced using the same materials as used in Sample No. 1. Then, an alumina pin having a convex shape was inserted into each of the windows 36 of the thus obtained diaphragm structure 22, such that the alumina pin applied a pressing force against the inner surface of the corresponding diaphragm portion (26). With the alumina pin inserted therein, the diaphragm structure 22 was re-fired at 1350° C. for three hours, to thus provide a diaphragm structure 22 having convex diaphragm portions (26). This diaphragm structure 22 was evaluated in respect of the stability of the convex shape of the diaphragm portions, and the result was "average".

What is claimed is:

1. A ceramic diaphragm structure comprising:
    a ceramic substrate having at least one window; and
    a ceramic diaphragm plate which is superposed on said ceramic substrate to close said at least one window, said diaphragm plate being fired with said ceramic substrate to form an integral sintered body, said diaphragm plate including at least one diaphragm portion which is aligned with said at least one window, respectively, each of said at least one diaphragm portion protruding outwards, in a direction away from a corresponding one of said at least one window, to form a convex shape.

2. A ceramic diaphragm structure as defined in claim 1, wherein said ceramic diaphragm plate comprises a material which contains a major component that is selected from the group consisting of stabilized zirconia, partially stabilized zirconia, alumina, and mixtures thereof.

3. A ceramic diaphragm structure as defined in claim 1, wherein said ceramic substrate and said ceramic diaphragm plate have an average crystal grain size of not larger than 5μm.

4. A ceramic diaphragm structure as defined in claim 1, wherein said at least one diaphragm portion has a thickness of not greater than 30μm.

5. A ceramic diaphragm structure as defined in claim 1, wherein said at least one diaphragm portion consists of a dense body having a relative density (bulk density/theoretical density) of at least 90%.

6. A ceramic diaphragm structure as defined in claim 1, wherein each of said at least one diaphragm portion protrudes outwards and a percentage (y) of an amount (h) of protrusion of a central part of said each diaphragm portion with respect to a length (m) of the shortest line which passes through a center of said corresponding one of said at least one window, as represented, by y=(h/m)×100, is not smaller than 1%.

7. A method of producing the ceramic diaphragm structure as defined in claim 1, comprising the steps of:
    preparing a ceramic green substrate having at least one window;
    preparing a thin ceramic green sheet;
    superposing said ceramic green sheet on said ceramic green substrate to close said at least one window, thereby to provide an integral green laminar structure; and
    firing said green laminar structure into an integral sintered body, whereby said ceramic green sheet provides at least one diaphragm portion which is aligned with said at least one window, respectively, each of said at least one diaphragm portion being formed into convex shape upon firing of said green laminar structure, and said each diaphragm portion protrudes outwards, in a direction away from a corresponding one of said at least one window.

8. A method as defined in claim 7, wherein a pre-sintering temperature and a shrinkage percentage of each of the green substrate and green sheet satisfy the following formulae:

$$S \text{ (substrate)} - S \text{ (sheet)} \geq -0.08 \{T_{70} \text{ (substrate)} - T_{70} \text{ (sheet)}\} - 1;$$

$$0 \leq T_{70} \text{ (substrate)} - T_{70} \text{ (sheet)} \leq 300; \text{ and}$$

$$S \text{ (substrate)} - S \text{ (sheet)} \leq 20,$$

where S (substrate) and S (sheet) represent respective shrinkage percentages (%) of said ceramic green substrate and said ceramic green sheet when the green substrate and green sheet are fired independently of each other at a temperature at which said green laminar structure is finally fired, said shrinkage percentages being calculated on the basis of lengths as measured in a plane of the green substrate or sheet, and where $T_{70}$ (substrate) and $T_{70}$ (sheet) represent respective pre-sintering temperatures (°C.) at which shrinkage percentages of said ceramic green substrate and said ceramic green sheet have reached 70% of S (substrate) and S (sheet), respectively, during firing of said ceramic green substrate and said ceramic green sheet independently of each other.

9. A method as defined in claim 8, wherein said ceramic green sheet and said ceramic green substrate are prepared to satisfy the following formulae:

$$S \text{ (substrate)} - S \text{ (sheet)} \geq -0.08 \{T_{70} \text{ (substrate)} - T_{70} \text{ (sheet)}\} + 0.8;$$

$$10 \leq T_{70} \text{ (substrate)} - T_{70} \text{ (sheet)} \leq 200; \text{ and}$$

$$S \text{ (substrate)} - S \text{ (sheet)} \leq 10.$$

10. A method as defined in claim 9, wherein said ceramic green sheet and said ceramic green substrate are prepared to satisfy the following formulae:

$$S \text{ (substrate)} - S \text{ (sheet)} \geq -0.08 \{T_{70} \text{ (substrate)} - T_{70} \text{ (sheet)}\} + 0.8;$$

$$10 \leq T_{70} \text{ (substrate)} - T_{70} \text{ (sheet)} \leq 100; \text{ and}$$

$$S \text{ (substrate)} - S \text{ (sheet)} \leq 5.$$

11. A method as defined in claim 7, wherein said ceramic green sheet comprises before or after firing a material which is selected from the group consisting of partially stabilized zirconia, fully stabilized zirconia, alumina and mixtures thereof, said material having an average particle size of 0.05 to 1.0μm.

12. A method as defined in claim 7, wherein said green laminar structure is fired at a temperature in a range of 1200° C. to 1700° C.

13. A method of producing the ceramic diaphragm structure as defined in claim 1, comprising the steps of:

preparing a ceramic green substrate having at least one window;

preparing a thin ceramic green sheet;

superposing said ceramic green sheet on said ceramic green substrate to close said at least one window, thereby to provide an integral green laminar structure;

firing said green laminar structure into an integral sintered body, whereby said ceramic green sheet provides at least one diaphragm portion which is aligned with said at least one window of said ceramic green substrate, respectively; and applying a pressure to each of said at least one diaphragm portion while heating said integral sintered body, whereby said each diaphragm portion protrudes outwards, in a direction away from a corresponding one of said at least one window.

* * * * *